(12) United States Patent
Jo

(10) Patent No.: US 11,716,904 B2
(45) Date of Patent: Aug. 1, 2023

(54) THERMOELECTRIC MODULE

(71) Applicant: LG INNOTEK CO., LTD., Seoul (KR)

(72) Inventor: Min Sung Jo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/295,106

(22) PCT Filed: Dec. 13, 2019

(86) PCT No.: PCT/KR2019/017688
§ 371 (c)(1),
(2) Date: May 19, 2021

(87) PCT Pub. No.: WO2020/130507
PCT Pub. Date: Jun. 25, 2020

(65) Prior Publication Data
US 2022/0020910 A1     Jan. 20, 2022

(30) Foreign Application Priority Data
Dec. 20, 2018   (KR) .......................... 10-2018-0166437

(51) Int. Cl.
*H10N 10/17*   (2023.01)
*H10N 10/01*   (2023.01)
*H10N 10/81*   (2023.01)

(52) U.S. Cl.
CPC ............. *H10N 10/17* (2023.02); *H10N 10/01* (2023.02); *H10N 10/81* (2023.02)

(58) Field of Classification Search
CPC ................................ H01L 35/10; H01L 35/32
See application file for complete search history.

(56) References Cited

U.S. PATENT DOCUMENTS

2006/0289051 A1* 12/2006 Niimi .................... H01L 35/32
136/203
2010/0163090 A1   7/2010 Liu et al.
(Continued)

FOREIGN PATENT DOCUMENTS

| KR | 10-2012-0066142 | 6/2012 |
| KR | 10-2018-0006741 | 1/2018 |
| KR | 10-2018-0033802 | 4/2018 |

OTHER PUBLICATIONS

International Search Report dated Mar. 25, 2020 issued in Application No. PCT/KR2019/017688.

*Primary Examiner* — Daniel P Malley, Jr.
(74) *Attorney, Agent, or Firm* — KED & Associates LLP

(57) ABSTRACT

Disclosed is a thermoelectric module. One embodiment of the thermoelectric modules comprises: a first substrate; a first electrode disposed on the first substrate; a thermoelectric leg disposed on the first electrode; a second electrode disposed on the thermoelectric leg; a second substrate disposed on the second electrode; a plurality of wire parts electrically connected to the first electrode and the second electrode; a first sealing part disposed on the first substrate and surrounding the side surface of the second substrate; and a second sealing part passing through the first sealing part and disposed on the inside and outside of the first sealing part. At least one of the plurality of wire parts is partially disposed inside the second sealing part. The second sealing part includes: a first region which is closest to the first sealing part outside the first sealing part; and a second region which is disposed outside the first region and is in contact with the wire part partially disposed inside the second sealing part, wherein the thickness of the second region is less than the thickness of the first region.

11 Claims, 11 Drawing Sheets

(56) References Cited

U.S. PATENT DOCUMENTS

2011/0290295 A1    12/2011  Veerasamy
2015/0325766 A1*  11/2015  Himmer .................. H01L 35/32
                                                                             136/205
2017/0365761 A1*  12/2017  Lee ........................ H10N 10/17

* cited by examiner

[FIG. 1]
10
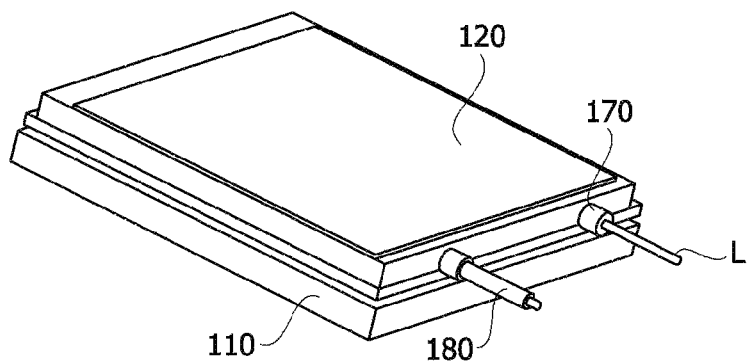

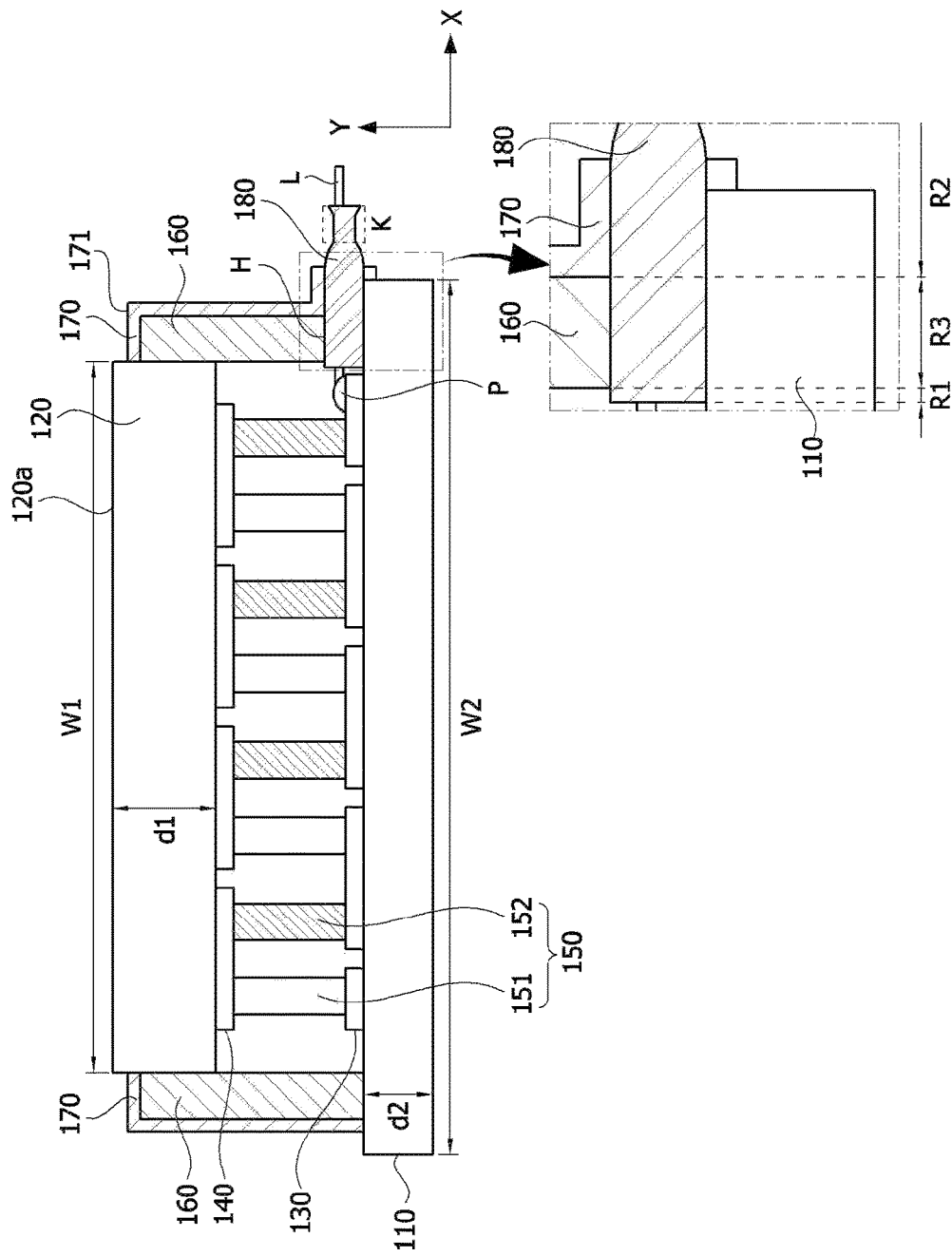

[FIG. 3]
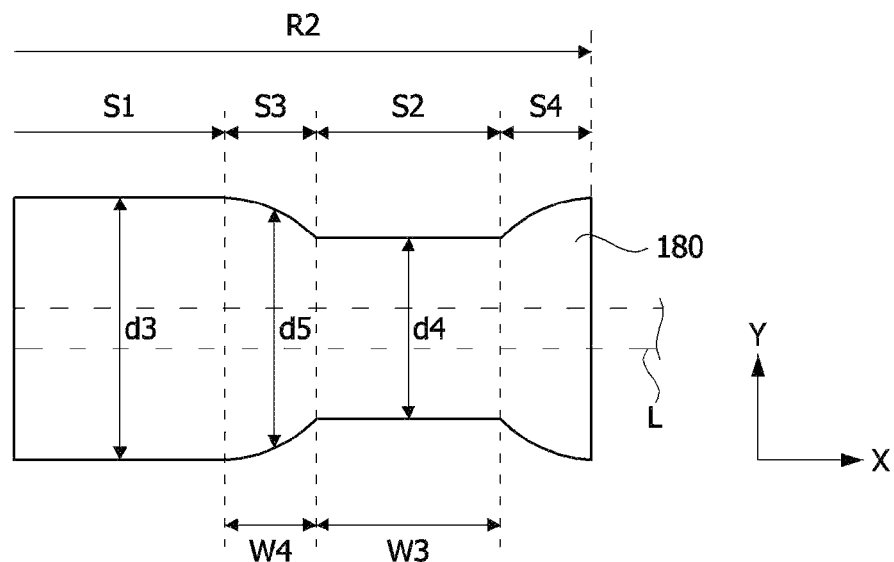
[FIG. 4]
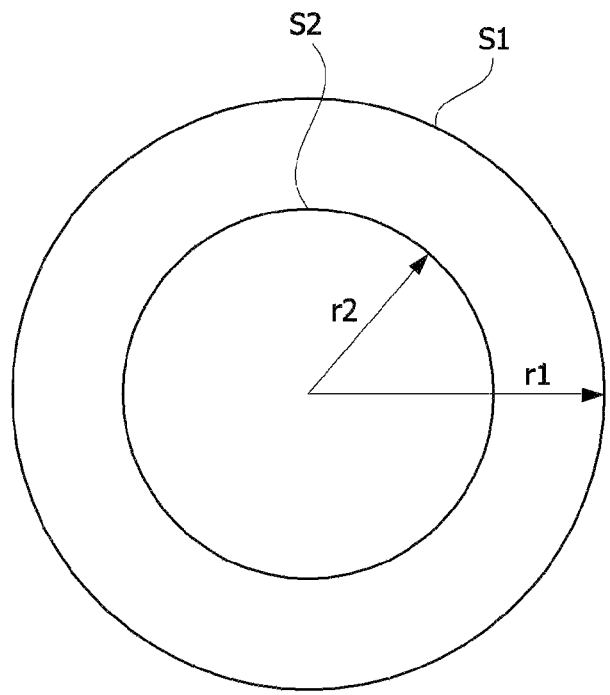

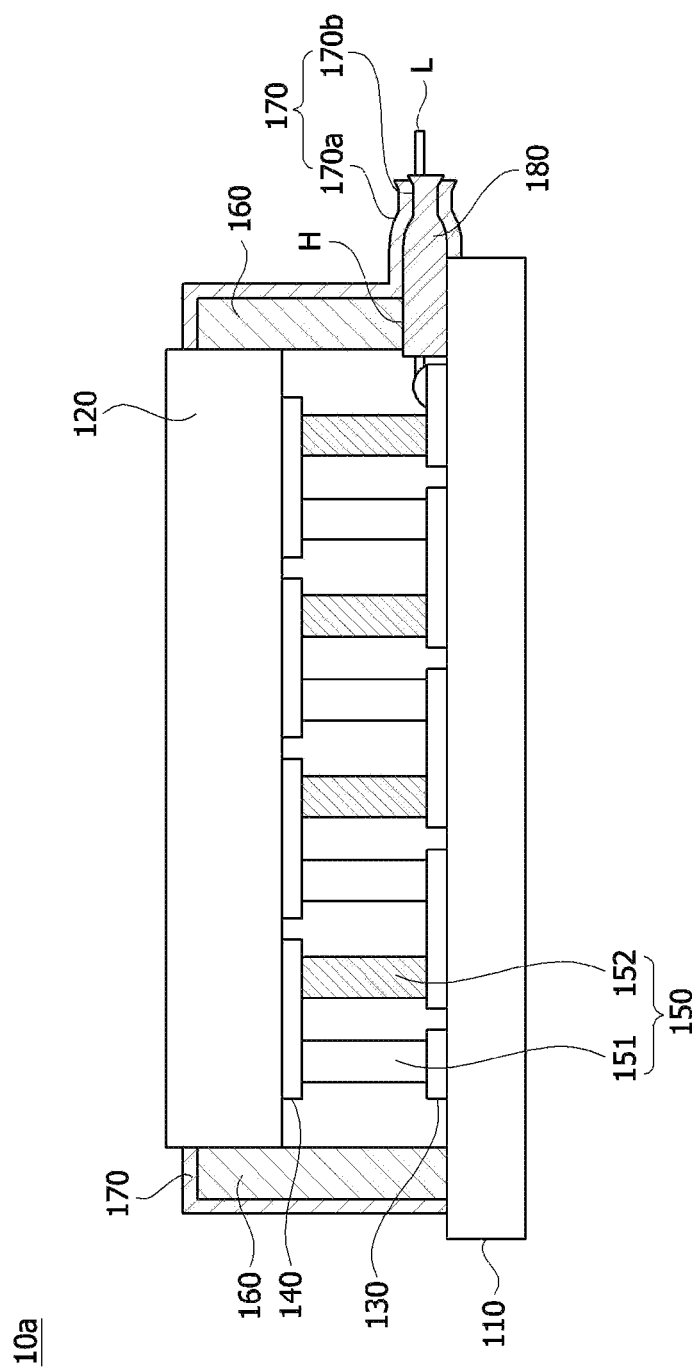
[FIG. 5]

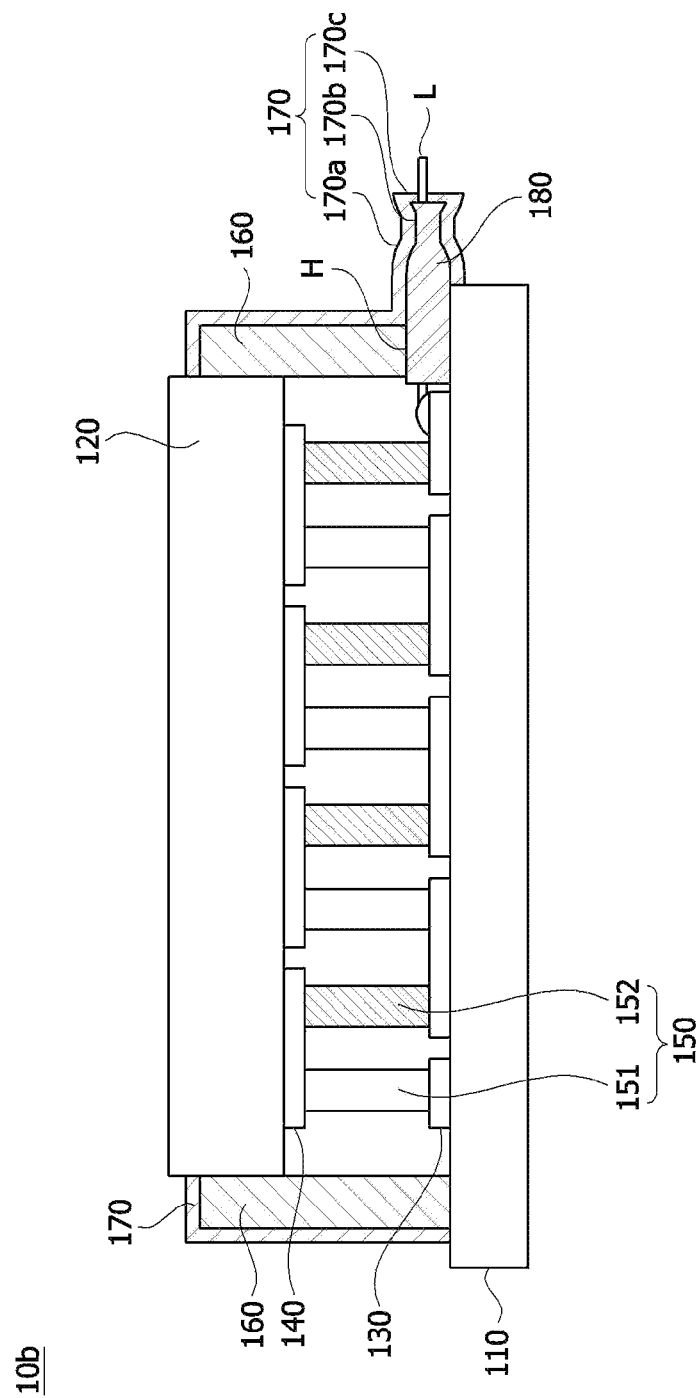
[FIG. 6]

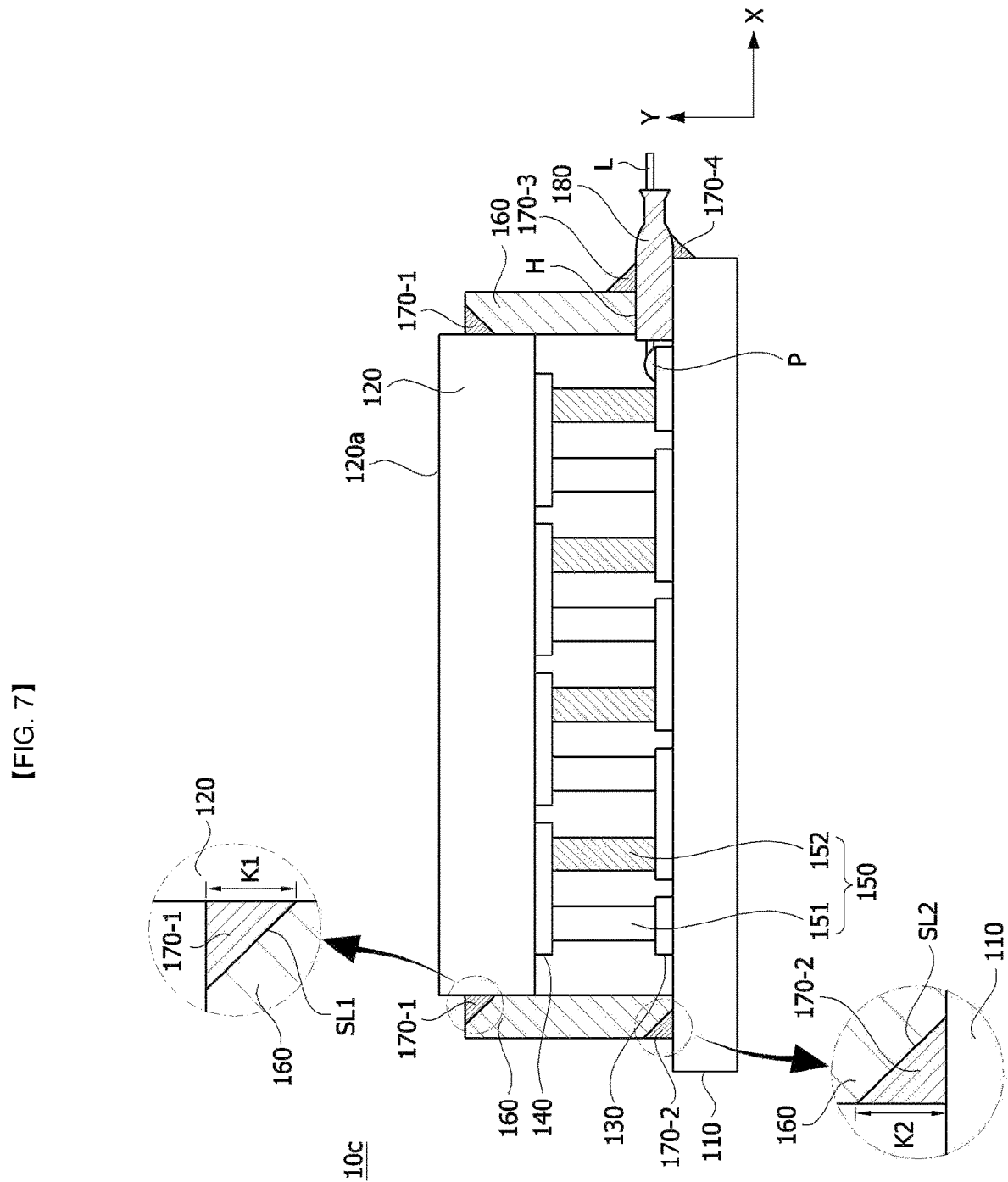

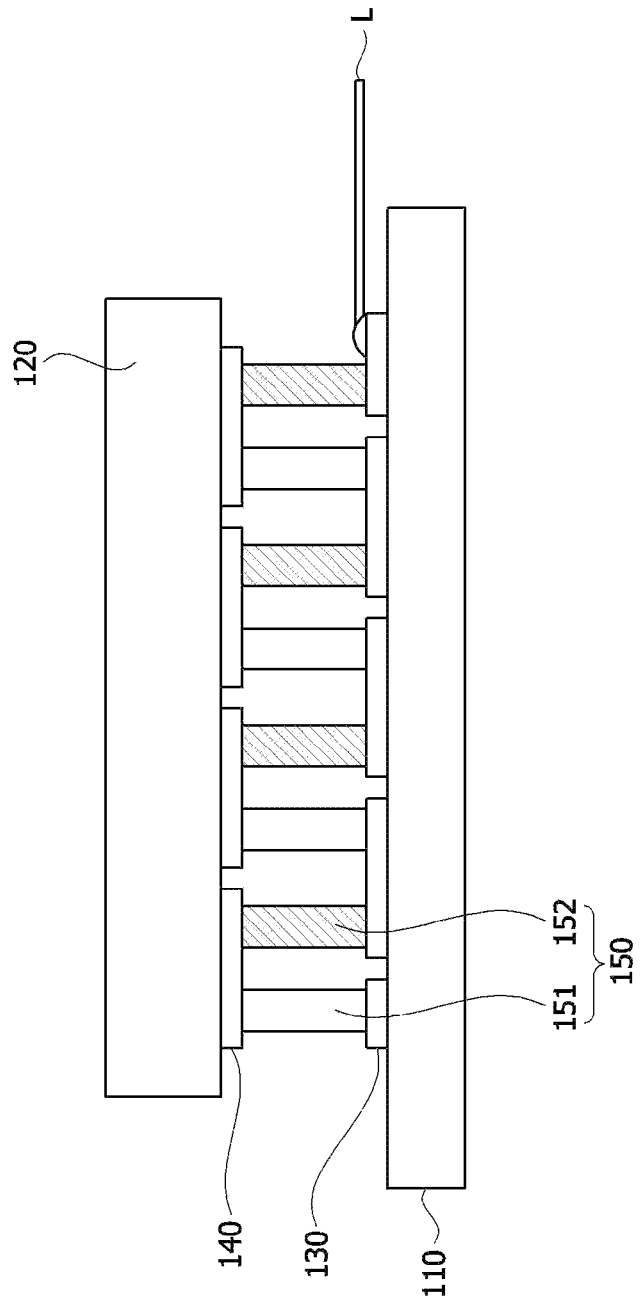

[FIG. 8B]
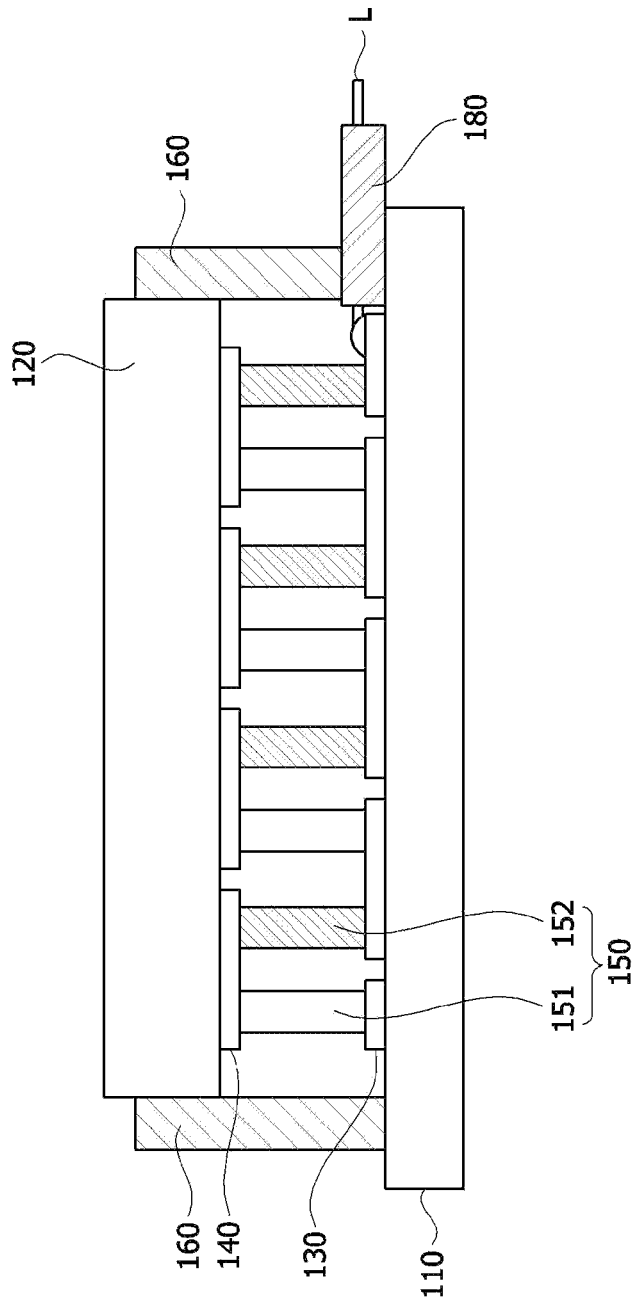

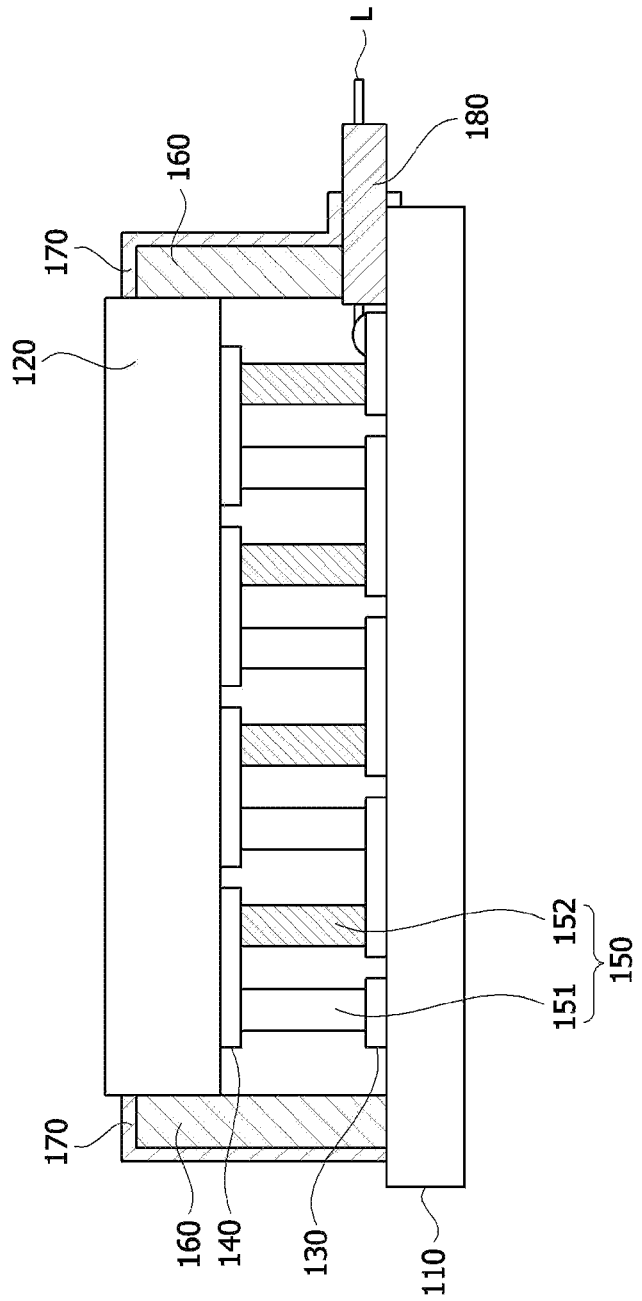
[FIG. 8C]

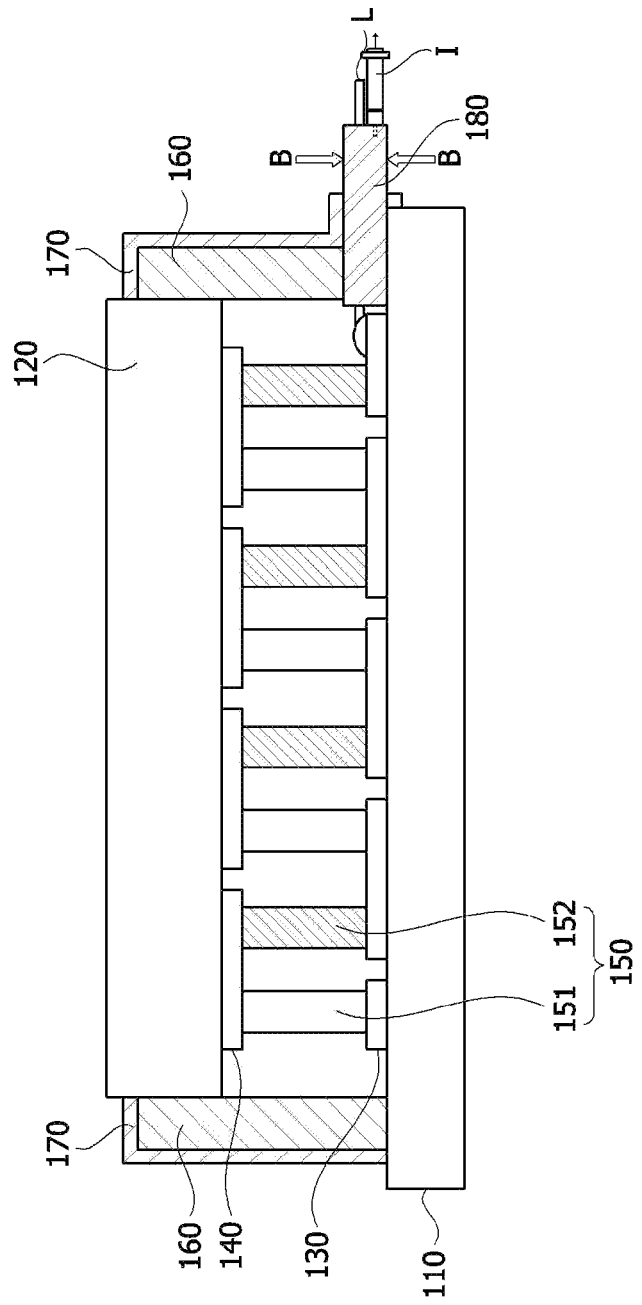
[FIG. 8D]

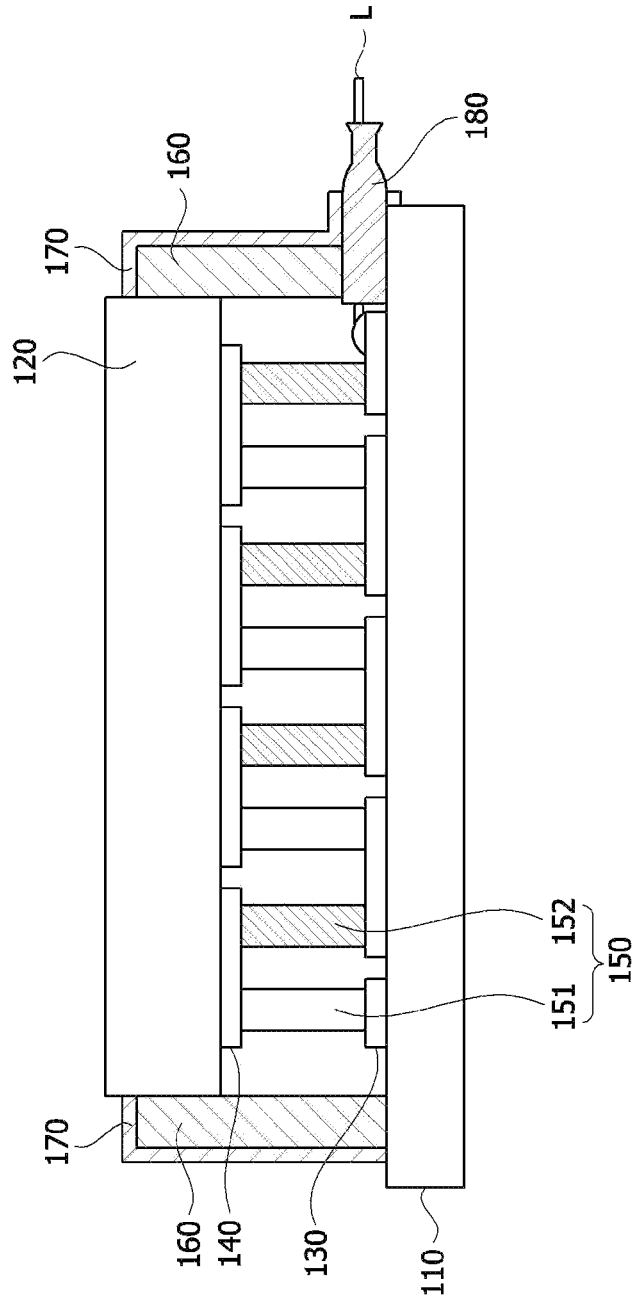

THERMOELECTRIC MODULE

CROSS-REFERENCE TO RELATED PATENT APPLICATIONS

This application is a U.S. National Stage Application under 35 U.S.C. § 371 of PCT Application No. PCT/KR2019/017688, filed Dec. 13, 2019, which claims priority to Korean Patent Application No. 10-2018-0166437, filed Dec. 20, 2018, whose entire disclosures are hereby incorporated by reference.

TECHNICAL FIELD

An embodiment relates to a thermoelectric module.

BACKGROUND ART

A thermoelectric phenomenon is a phenomenon which occurs due to movement of electrons and holes in a material and refers to direct energy conversion between heat and electricity.

A thermoelectric element is a generic term for a device using the thermoelectric phenomenon and has a structure in which a P-type thermoelectric material and an N-type thermoelectric material are joined between metal electrodes to form a PN junction pair.

Thermoelectric elements can be classified into a device using temperature changes of electrical resistance, a device using the Seebeck effect, which is a phenomenon in which an electromotive force is generated due to a temperature difference, a device using the Peltier effect, which is a phenomenon in which heat absorption or heat generation by current occurs, and the like.

The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element is increasing more and more.

DISCLOSURE

Technical Problem

An embodiment relates to a thermoelectric module which easily extracts gas in the module through a cover part along wires extending to the outside.

Further, an embodiment relates to a thermoelectric module with improved cooling power due to gas extraction.

In addition, an embodiment relates to a thermoelectric module in which condensation is prevented and reliability is improved.

Problems to be solved by the embodiment are not limited to the above-described problems, and purposes and effects understood from the solutions and embodiments which will be described below are also included.

Technical Solution

A thermoelectric module according to an embodiment includes: a first substrate; a first electrode disposed on the first substrate; a thermoelectric leg disposed on the first electrode; a second electrode disposed on the thermoelectric leg; a second substrate disposed on the second electrode; a plurality of wire parts electrically connected to the first electrode and the second electrode; a first sealing part disposed on the first substrate, and surrounding a side surface of the second substrate; and a second sealing part passing through the first sealing part to be disposed at an inner side and an outer side of the first sealing part, wherein at least one of the plurality of wire parts is partially disposed in the second sealing part, the second sealing part includes a first region most adjacent to the first sealing part at the outer side of the first sealing part, and a second region which is disposed at an outer side of the first region and comes into contact with the wire part partially disposed in the second sealing part, and a thickness of the second region is smaller than a thickness of the first region.

The first region may be disposed to be spaced apart from the wire part partially disposed in the second sealing part.

The second sealing part may further include a third region disposed between the first region and the second region, and a thickness of the third region may decrease as the third region becomes closer to the second region.

The thermoelectric module may further include a third sealing part disposed between the first substrate and the first sealing part, between the second substrate and the first sealing part, and between the first substrate and the second sealing part.

An upper surface of the first sealing part may be disposed under an upper surface of the first substrate, and an upper surface of the third sealing part may be disposed under the upper surface of the first substrate.

The third sealing part may extend to an outer side of the second region on the second sealing part, and the third sealing part may extend to an outer side of the second sealing part and onto the plurality of wire parts.

An elongation rate of the first region may be greater than an elongation rate of the second region.

The first sealing part may be disposed to extend along an edge of an upper surface of the second substrate.

The first sealing part may be disposed to surround the second electrode, the first electrode, and the thermoelectric leg.

A method of manufacturing a thermoelectric module according to an embodiment includes: disposing a first substrate, a first electrode disposed on the first substrate, a thermoelectric leg disposed on the first electrode, a second electrode disposed on the thermoelectric leg, a second substrate disposed on the second electrode, and a plurality of wire parts electrically connected to one of the first electrode and the second electrode; disposing a first sealing part on a side surface of the second substrate on the first substrate, and disposing a second sealing part to pass through the first sealing part; and extracting a gas in the first sealing part and bonding an inner surface of the second sealing part and outer surfaces of the plurality of wire parts.

Advantageous Effects

According to an embodiment, a packaged thermoelectric module can be implemented.

Further, a thermoelectric module with improved cooling power can be provided.

In addition, a thermoelectric module in which condensation is prevented and reliability is improved can be provided.

Various useful advantages and effects of the present invention are not limited to the above and can be relatively easily understood in a process of describing exemplary embodiments of the present invention.

DESCRIPTION OF DRAWINGS

FIG. 1 is a perspective view of a thermoelectric module according to a first embodiment of the present invention.

FIG. 2 is a cross-sectional view of the thermoelectric module according to the first embodiment of the present invention.

FIG. 3 is an enlarged view of portion K in FIG. 2.

FIG. 4 is a cross-sectional view of a second sealing part according to the first embodiment of the present invention.

FIG. 5 is a cross-sectional view of a thermoelectric module according to a second embodiment.

FIG. 6 is a cross-sectional view of a thermoelectric module according to a third embodiment.

FIG. 7 is a cross-sectional view of a thermoelectric module according to a fourth embodiment.

FIGS. 8A to 8E are flow charts for describing a method of manufacturing the thermoelectric module according to the first embodiment.

MODES OF THE INVENTION

Hereinafter, preferred embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as at least one (or one or more) of "A, B, and C".

Further, terms such as first, second, A, B, (a), (b), and the like may be used to describe elements of the embodiments of the present invention.

The terms are only provided to distinguish the elements from other elements, and the essence, sequence, order, or the like of the elements are not limited by the terms.

Further, when particular elements are disclosed as being "connected," "coupled," or "linked" to other elements, this may not only include a case of elements being directly connected, coupled, or linked to other elements but also a case of elements being connected, coupled, or linked to other elements by still other elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included based on one element.

FIG. 1 is a perspective view of a thermoelectric module according to a first embodiment of the present invention, FIG. 2 is a cross-sectional view of the thermoelectric module according to the first embodiment of the present invention, FIG. 3 is an enlarged view of portion K in FIG. 2, and FIG. 4 is a cross-sectional view of a second sealing part according to the first embodiment of the present invention.

Referring to FIGS. 1 and 2, a thermoelectric module 10 according to the first embodiment of the present invention may include a first substrate 110, a second substrate 120, a first electrode 130, a second electrode 140, a thermoelectric leg 150, a first sealing part 160, a third sealing part 170, a second sealing part 180, and a plurality of wire parts L.

First, the second substrate 120 may be disposed at an upper portion of the thermoelectric module 10. Further, the first substrate 110 may be disposed at a lower portion of the thermoelectric module 10, and may be disposed to face the second substrate 120.

The second electrode 140 may be disposed under the second substrate 120, and the first electrode 130 may be disposed on the first substrate 110. The second electrode 140 and the first electrode 130 may be disposed to face each other. Further, a plurality of thermoelectric legs 150 may be disposed between the second electrode 140 and the first electrode 130 so that the second electrode 140 and the first electrode 130 facing each other may be electrically connected to each other through the thermoelectric legs 150 disposed therebetween. These thermoelectric legs 150 may include first thermoelectric legs 151 and second thermoelectric legs 152 in plural numbers.

More specifically, the second substrate 120 and the first substrate 110 may be disposed at an upper portion and a lower portion, respectively, and may be disposed to face each other. Further, each of the second substrate 120 and the first substrate 110 may be formed of a thermally conductive material to facilitate heat conduction with a device in contact therewith. In addition, each of the second substrate 120 and the first substrate 110 may be an insulating substrate or a metal substrate.

In the embodiment, the insulating substrate may be an alumina substrate or a polymer resin substrate having flexibility. The flexible polymer resin substrate may include various insulating resin materials including highly permeable plastic such as polyimide (PI), polystyrene (PS), polymethyl methacrylate (PMMA), a cyclic olefin copolymer (COC), polyethylene terephthalate (PET), or a resin, and the like. The metal substrate may include Cu, a Cu alloy, or a Cu—Al alloy, and a thickness thereof may be 0.1 mm to 0.5 mm. When the thickness of the metal substrate is less than 0.1 mm or exceeds 0.5 mm, since heat dissipation characteristics or thermal conductivity may be excessively high, reliability of the thermoelectric element may be degraded.

Further, when the second substrate 120 and the first substrate 110 are metal substrates, dielectric layers (not shown) may be further formed between the second substrate 120 and the second electrode 140 and between the first substrate 110 and the first electrode 130, respectively. Each of the dielectric layers (not shown) may include a material having a thermal conductivity of 5 to 10 W/K, and may be formed with a thickness of 0.01 mm to 0.15 mm. When the thickness of the dielectric layer (not shown) is less than 0.01 mm, insulation efficiency or withstand voltage characteristics may be degraded, and when the thickness of the dielectric layer exceeds 0.15 mm, since thermal conductivity may be lowered, heat dissipation efficiency may be degraded.

Further, the second substrate 120 and the first substrate 110 may be formed to have different sizes. For example, a volume, a thickness, or an area of one of the second substrate 120 and the first substrate 110 may be formed larger than a volume, a thickness, or an area of the other. Accordingly, it is possible to increase the heat absorption performance or heat dissipation performance of the thermoelectric element.

Further, a heat dissipation pattern, for example, an uneven pattern may be formed on a surface of at least one of the second substrate 120 and the first substrate 110. Accordingly, it is possible to increase the heat dissipation performance of the thermoelectric element. When the uneven pattern is formed on a surface which comes into contact with the first thermoelectric legs 151 or the second thermoelectric legs 152, bonding characteristics between the thermoelectric legs and the substrate may also be improved.

The second electrode 140 may be disposed between the second substrate 120 and upper surfaces of the first thermoelectric leg 151 and the second thermoelectric leg 152, and the first electrode 130 may be disposed between the first substrate 110 and lower surfaces of the first thermoelectric leg 151 and the second thermoelectric leg 152. Accordingly, the second electrode 140 and the first electrode 130 may be electrically connected to the plurality of first thermoelectric legs 151 and the plurality of second thermoelectric legs 152 disposed between the second electrode 140 and the first electrode 130.

Here, each of the first electrode 130 disposed between the first substrate 110 and the first and second thermoelectric legs 151 and 152, and the second electrode 140 disposed between the second substrate 120 and the first and second thermoelectric legs 151 and 152 may include at least one of copper (Cu), silver (Ag), and nickel (Ni), and may have a thickness of 0.01 mm to 0.3 mm. When the thickness of the second electrode 140 or the first electrode 130 is less than 0.01 mm, a function as an electrode may be degraded, and thus electrical conduction performance may be lowered, and when the thickness of the second electrode 140 or the first electrode 130 exceeds 0.3 mm, conduction efficiency may decrease due to an increase in resistance.

Further, as described above, the thermoelectric leg 150 may be disposed between the second electrode 140 and the first electrode 130 and may be plural in number. The thermoelectric leg 150 may include the first thermoelectric leg 151 and the second thermoelectric leg 152.

Further, the first thermoelectric leg 151 and the second thermoelectric leg 152 may form a pair of unit cells disposed between the second electrode 140 and the first electrode 130 and electrically connected to each other. In addition, in the embodiment, the first thermoelectric leg 151 may be a P-type thermoelectric semiconductor leg, and the second thermoelectric leg 152 may be an N-type thermoelectric semiconductor leg.

In addition, when a voltage is applied to the first electrode 130 and the second electrode 140 through the plurality of wire parts L, a substrate in which a current flows from the first thermoelectric leg 151 to the second thermoelectric leg 152 due to the Peltier effect may absorb heat to act as a cooling part and a substrate in which a current flows from the second thermoelectric leg 152 to the first thermoelectric leg 151 may be heated to act as a heat generating part.

Here, the first thermoelectric leg 151 and the second thermoelectric leg 152 may be bismuth-telluride (Bi—Te)-based thermoelectric legs including bismuth (Bi) and tellurium (Ti) as main raw materials.

Further, the first thermoelectric leg 151 may be a thermoelectric leg including a bismuth-telluride (Bi—Te)-based main raw material in an amount of 99 to 99.999 wt % including at least one among antimony (Sb), nickel (Ni), aluminum (Al), copper (Cu), silver (Ag), lead (Pb), boron (B), gallium (Ga), tellurium (Te), bismuth (Bi), and indium (In), and a mixture in an amount of 0.001 to 1 wt % including Bi or Te based on 100 wt % of the total weight. For example, the main raw material may be Bi—Se—Te, and Bi or Te may be further included in an amount of 0.001 to 1 wt % of the total weight.

Further, the second thermoelectric leg 152 may be a thermoelectric leg including a bismuth-telluride (Bi—Te)-based main raw material in an amount of 99 to 99.999 wt % including at least one among selenium (Se), nickel (Ni), aluminum (Al), copper (Cu), silver (Ag), lead (Pb), boron (B), gallium (Ga), tellurium (Te), bismuth (Bi), and indium (In), and a mixture in an amount of 0.001 to 1 wt % including Bi or Te based on 100 wt % of the total weight. For example, the main raw material may be Bi—Sb—Te, and Bi or Te may be further included in an amount of 0.001 to 1 wt % of the total weight.

The first thermoelectric legs 151 and the second thermoelectric legs 152 may be formed in a bulk type or a stacked type. Generally, the bulk type first thermoelectric legs 151 or second thermoelectric legs 152 may be obtained through a process of producing an ingot by heat-treating a thermoelectric material, pulverizing and sieving the ingot to obtain powder for thermoelectric legs, sintering the powder, and cutting the sintered object. The stacked type first thermoelectric legs 151 or second thermoelectric legs 152 may be obtained through a process of forming a unit member by applying a paste including a thermoelectric material on a sheet-shaped base material and then stacking and cutting the unit member. However, the present invention is not limited to these configurations.

In this case, one pair of the first thermoelectric leg 151 and the second thermoelectric leg 152 may have the same shape and volume or may have different shapes and volumes. For example, since electrical conduction characteristics of the first thermoelectric leg 151 and the second thermoelectric leg 152 are different, a height or cross-sectional area of the second thermoelectric leg 152 may be formed differently from a height or cross-sectional area of the first thermoelectric leg 151.

The performance of the thermoelectric element according to the embodiment of the present invention may be expressed by the Seebeck index. The Seebeck index (ZT) may be expressed as in Equation 1.

$$ZT = \alpha^2 \cdot \sigma \cdot T/k \quad \text{[Equation 1]}$$

Here, $\alpha$ is the Seebeck coefficient [V/K], $\sigma$ is electrical conductivity [S/m], and $\alpha 2\sigma$ is a power factor (W/mK2]). Further, T is a temperature, and k is thermal conductivity [W/mK]. k may be expressed as $a \cdot cp \cdot \rho$, wherein a is thermal diffusivity [cm2/S], cp is specific heat [J/gK], and $\rho$ is density [g/cm3].

Further, in order to obtain the above-described Seebeck index, a Z value (V/K) is measured using a Z meter, and the Seebeck index (ZT) may be calculated using the measured Z value.

In addition, the first thermoelectric leg 151 or the second thermoelectric leg 152 may have a cylindrical shape, a polygonal pillar shape, an oval pillar shape, or the like. In addition, a width of a portion of the first thermoelectric leg 151 or the second thermoelectric leg 152 to be bonded to the electrode may be variously adjusted.

The first sealing part 160 may be disposed to surround the second substrate 120 and the first substrate 110 by coming into contact with the second substrate 120 and the first substrate 110. The first sealing part 160 may be disposed on the first substrate 110 so as to come into contact with side surfaces of the second substrate 120. Specifically, the first sealing part 160 may be disposed to extend along an edge of an upper surface of the first substrate 110. Further, the first sealing part 160 may be disposed to come into contact with the side surfaces of the second substrate 120. That is, the first sealing part 160 may be disposed to surround the second electrode 140, the first electrode 130, and the thermoelectric leg 150 disposed between the second substrate 120 and the first substrate 110.

Further, an upper surface of the first sealing part 160 may form a step with an upper surface 120a of the second substrate 120. In the embodiment, the upper surface of the first sealing part 160 may be disposed under the upper surface 120a of the second substrate 120. Further, the upper surface of the third sealing part 170 disposed on the first sealing part 160 may form a step with the upper surface 120a of the second substrate 120. In addition, the upper surface of the third sealing part 170 may be disposed under the upper surface 120a of the second substrate 120. According to this configuration, when the second substrate 120 comes into contact with an external device, since the third sealing part 170 and the first sealing part 160 do not reduce a contact surface between the second substrate 120 and the external device, heat exchange between the thermoelectric module 10 and the external device may be easily performed.

Further, the first sealing part 160 may be coupled to the second substrate 120, the first substrate 110, and the third sealing part 170 through the second sealing part 180 which will be described later. To this end, the first sealing part 160 may have an inclined surface in a region where the third sealing part 170 is located. Contents which will be described later in FIG. 7 may be equally applied to a structure of this inclined surface. That is, since the first sealing part 160 has an inclined surface in one side portion as shown in FIG. 7 and the third sealing part 170 is disposed on the inclined surface, and thus a coupling area with the third sealing part 170 increases, bonding strength with other components (the first and second substrates 110 and 120, and the like) may be improved, and reliability of the thermoelectric module may be improved.

Further, the first sealing part 160 may include an opening H. The opening H may be disposed in an extending direction of the above-described plurality of wire parts L in the first sealing part 160. That is, the opening H may be disposed to correspond to positions of the plurality of wire parts L in the first sealing part 160. In the embodiment, the plurality of wire parts L may extend in a first direction (X-axis direction), and the opening H may be disposed in a region of the first sealing part 160 overlapping the plurality of wire parts L in the first direction.

Further, a second direction (Y-axis direction) is a direction perpendicular to the first direction (X-axis direction), a direction in which each thermoelectric leg extends, and a direction which serves as a reference for describing upper and lower portions.

In addition, the maximum width of each of the plurality of wire parts L may be smaller than the maximum width of the opening H. For example, the plurality of wire parts L and the opening H may each have a circular shape, and in this case, a diameter of the opening H may be larger than a diameter of each of the plurality of wire parts L. However, the plurality of wire parts L and the opening H may have various shapes, but will be described in a circular shape hereinafter. Further, the plurality of wire parts L may be electrically connected to the second electrode 140 or the first electrode 130. Hereinafter, the plurality of wire parts L may be electrically connected to the first electrode 130, and a contact point P may be disposed on the first electrode 130.

Further, the opening H may be disposed on the upper surface of the first substrate 110. In the embodiment, the opening H may be disposed adjacent to the first substrate 110 having a larger width among the second substrate 120 and the first substrate 110. According to this configuration, since an extending distance of the first electrode 130 from the contact point P is minimized and an extending direction is maintained in the first direction (X-axis direction), the plurality of wire parts L are less bent, and thus the reliability of the plurality of wire parts L may be improved. Further, since the second sealing part 180 which will be described later is disposed under the first sealing part 160 to support the first sealing part 160, a larger load is received by the first sealing part 160 compared to a case in which the second sealing part 180 is disposed at an inner side of the first sealing part 160, and thus a coupling force with the first sealing part 160 may increase. Accordingly, reliability may be improved. For example, a width W2 of the first substrate 110 may be 65 mm to 80 mm. Further, a width W1 of the second substrate 120 may be 50 mm to 60 mm. In addition, a thickness d1 of the second substrate 120 may be 4 mm to 6 mm, and a thickness d2 of the first substrate 110 may be 1.6 mm to 2.4 mm. In addition, the second substrate 120 may operate as a heat absorption part, and the first substrate 110 may operate as a heat generating part. Also, hereinafter, an inner side refers to a direction toward a space enclosed by the first sealing part, the second sealing part, the second substrate, and the first substrate, and an outer side refers to a direction toward the outside of the first sealing part, the second sealing part, the second substrate, and the first substrate in the enclosed space.

The third sealing part 170 may be disposed at an outer side of the first sealing part 160 and may be disposed to surround the first sealing part 160. The third sealing part 170 may seal the inside of the first sealing part by improving a bonding force with other components which come into contact with the first sealing part 160. In the embodiment, the third sealing part 170 may be disposed in the region to seal a region between the second substrate 120 and the first sealing part 160, a region between the first substrate 110 and the first sealing part 160, and a region between the first substrate 110 and the second sealing part 180.

Further, as described above, the upper surface of the third sealing part 170 may be disposed under the upper surface 120a of the second substrate 120. In addition, the third sealing part 170 may extend to an outer side of the first substrate 110 along the second sealing part 180. In this case, the third sealing part 170 may be disposed up to a third region S3 which will be described later. According to this configuration, since the coupling force between the plurality of wire parts L and the second sealing part 180 may be improved, the durability of the thermoelectric module may be improved from a difference in atmospheric pressure between an internal pressure and an external pressure.

Further, the third sealing part 170 may be formed of a material having high durability against moisture such as water and temperature. For example, the third sealing part 170 may include a butyl-based resin, an epoxy-based resin, or a silicone-based resin. However, the third sealing part 170 is not limited to these materials.

The second sealing part 180 may be disposed in the opening H of the first sealing part 160 described above. Further, the second sealing part 180 may be disposed to partially surround the plurality of wire parts L.

In addition, the second sealing part 180 may be disposed to extend from the inner side of the first sealing part 160 to the outer side of the first sealing part 160. In addition, the second sealing part 180 may be disposed to extend to the outer side of the first substrate 110.

Specifically, the second sealing part 180 may include an inner region R1 disposed at the inner side of the first sealing part 160 based on the second direction (Y-axis direction), an outer region R2 disposed at the outer side of the first sealing part 160, and an overlapping region R3 overlapping the first sealing part 160 in the second direction.

In this case, the second sealing part 180 may be disposed to extend in the same direction as the extending direction of the plurality of wire parts L. Further, the overlapping region R3 may be disposed in the opening H, and the outer region R2 may come into contact with the third sealing part 170.

In addition, the second sealing part 180 is formed of a heat shrinkable tube which may contract by heat, and thus may seal the plurality of wire parts L when heat is applied. That is, the second sealing part 180 may be disposed in close contact with the outer surfaces of the plurality of wire parts L in a partial region.

Further, the second sealing part 180 and the opening H may be disposed to correspond to any one of the plurality of wire parts L. For example, the plurality of wire parts may have first and second polarities and thus may be two wire parts, and the second sealing part 180 and the opening H may be disposed to correspond to at least one of the plurality of wire parts having the first polarity and the plurality of wire parts having the second polarity. In the embodiment, when the second sealing part 180 is disposed on one wire part, the inside may be easily made into a vacuum state using the sealing part 180 surrounding the one wire part in the process. Further, when the second sealing part 180 is disposed on all wire parts, since an amount of fluid extracted to the outside at the same time increases, a process time may be shortened.

Referring to FIGS. 3 and 4, the second sealing part 180 may extend to the outer side of the first sealing part 160 and may include a first region S1, a third region S3, and a second region S2 sequentially disposed in an outward direction.

The first region S1 is a region closest to the first sealing part 160 and may have the largest thickness d3. Further, the third region S3 may come into contact with the first region S1 and have an inclined outer surface, and a thickness d5 of the third region S3 may decrease toward the outer side. In addition, the second region S2 may come into contact with the third region S3 and may have the smallest thickness d4. The second region S2 may be a region to which heating is applied, as described later, and may contract.

The first region S1 may have a tensile strength greater than a tensile strength of the second region S2 or the third region S3. Further, the third region S3 may have a tensile strength less than the tensile strength of the first region S1 and greater than the tensile strength of the second region S2. In addition, the tensile strength of the second region S2 may be less than the tensile strength of the first region S1 or the tensile strength of the third region S3. According to this configuration, since the second region S2 has a higher tensile strength than the first region S1 and the third region S3, a change in appearance due to a pressure difference between the external pressure and the internal pressure may be prevented, and durability may be improved. For example, the tensile strength of the first region S1 may be 1.1 kgf/mm2, the tensile strength of the third region S3 may be less than 1.1 kgf/mm2 and greater than 0.8 kgf/mm2, and the tensile strength of the second region S2 may be less than 0.8 kgf/mm2.

Further, the first region S1 may have an elongation rate of at least two times an elongation rate of the second region S2, and the third region S3 may have an elongation rate of one to two times the elongation rate of the second region S2.

In addition, the ratio of a maximum width W4 of the third region S3 and a maximum width W3 of the second region S2 may be 1:2 to 1:6. When the ratio is less than 1:2, since a bonding area between the plurality of wire parts L and the second sealing part 180 decreases in the second region S2, the coupling force may be reduced. Further, when the ratio is greater than 1:6, since the width of the third region S3 decreases, and thus the thickness of the third region S3 rapidly decreases from the first region S1 to the second region S2, there is a limit in that the reliability is degraded.

In addition, like the thicknesses of the above-described regions, a diameter r1 of the first region S1 may be larger than a diameter r2 of the second region S2. For example, the diameter r1 of the first region S1 may be 3.68 mm to 5.52 mm, and the diameter of the second region S2 may be 2.56 mm to 3.84 mm.

In addition, the second sealing part 180 may further include a fourth region S4 and the fourth region S4 may be disposed at an outer side from the second region S2. In addition, in the fourth region S4, the outer surfaces of the plurality of wire parts L and the inner surface of the second sealing part 180 may not come into contact with each other.

In addition, the second region S2 may be a region which comes into contact with the outer surfaces of the plurality of wire parts L. More specifically, the inner surface of the second sealing part 180 in the second region S2 may come into contact with the outer surfaces of the plurality of wire parts L to prevent the introduction of fluid into the inside from the outside and easily maintain a difference in atmospheric pressure between the inner side and outer side of the thermoelectric module. In this case, the inside of the thermoelectric module 10 may be kept in a vacuum. As will be described later, the thermoelectric module 10 according to the first embodiment may provide improved thermoelectric performance by blocking heat absorbed by an internal gas in heat exchange between the heat absorption part and the heat generating part while the inside of the thermoelectric module 10 is in a vacuum state. Further, it is possible to improve the reliability of the thermoelectric module by preventing a condensation phenomenon from occurring therein. Contents providing this vacuum state will be described later.

FIG. 5 is a cross-sectional view of a thermoelectric module according to a second embodiment.

Referring to FIG. 5, the contents of the second substrate 120, the first substrate 110, the second electrode 140, the first electrode 130, the thermoelectric leg 150, the first sealing part 160, the third sealing part 170, the second sealing part 180, and the plurality of wire parts L which are described above in the thermoelectric module according to the first embodiment may be equally applied to a thermoelectric module 10a according to the second embodiment.

However, in the thermoelectric module 10a according to the second embodiment, the third sealing part 170 may further extend outward on the second region of the second sealing part 180. For example, the third sealing part 170 may include a third-1 sealing part 170a disposed at an inner side on the second region of the second sealing part 180 and a third-2 sealing part 170b. In the embodiment, the third-2 sealing part 170b is disposed at an outer side on the second region, and thus the coupling force between the second sealing part 180 and the third sealing part 170 and the coupling force between the plurality of wire parts L and the second sealing part 180 may be further improved.

FIG. 6 is a cross-sectional view of a thermoelectric module according to a third embodiment.

Referring to FIG. 6, the contents of the second substrate 120, the first substrate 110, the second electrode 140, the first electrode 130, the thermoelectric leg 150, the first sealing part 160, the third sealing part 170, the second sealing part 180, and the plurality of wire parts L which are described above in the thermoelectric module according to the first embodiment may be equally applied to a thermoelectric module 10b according to the third embodiment.

However, in the thermoelectric module 10b according to the third embodiment, the third sealing part 170 may further extend outside the second sealing part 180. For example, the third sealing part 170 may include a third-1 sealing part 170a disposed at an inner side on the second region of the second sealing part 180, a third-2 sealing part 170b disposed at an outer side on the second region of the second sealing part 180, and a third-3 sealing part 170c disposed at the outer side of the second sealing part 180. The contents described in the first embodiment and the second embodiment may be equally applied to the third-1 sealing part 170a and the third-2 sealing part 170b.

Further, the third-3 sealing part 170c may be disposed at the outer side of the second sealing part 180 and may be disposed to cover an upper surface and an outer surface of the second sealing part 180 and some of the plurality of wire parts L. Accordingly, in the embodiment, the third-3 sealing part 170c may be disposed at the outer side of the second sealing part 180 to improve the coupling force between the second sealing part 180 and the third sealing part 170 and the coupling force between the plurality of wire parts L and the second sealing part 180 and protect the plurality of wire parts L from foreign substances.

FIG. 7 is a cross-sectional view of a thermoelectric module according to a fourth embodiment.

Referring to FIG. 7, the contents of the second substrate 120, the first substrate 110, the second electrode 140, the first electrode 130, the thermoelectric leg 150, the first sealing part 160, the third sealing part 170, the second sealing part 180, and the plurality of wire parts L which are described above in the thermoelectric module according to the first embodiment other than contents which will be described later may be equally applied to a thermoelectric module 10c according to the fourth embodiment.

The third sealing part may be disposed in various positions to couple components and improve the reliability of the thermoelectric module. Specifically, a third sealing part 170-1 (hereinafter, interchanged with a first sub-sealing part) may be disposed between the second substrate 120 and the first sealing part 160. The first sub-sealing part 170-1 may have a first inclined surface SL1. That is, the first sealing part 160 may also have an inclined surface corresponding to the first inclined surface SL1 of the first sub-sealing part 170-1. Further, a thickness K1 of the first sub-sealing part 170-1 may decrease from the inner side to the outer side due to the first inclined surface SL1. In other words, the thickness K1 of the first sub-sealing part 170-1 may increase as the first sub-sealing part 170-1 becomes closer to the second substrate 120. According to this configuration, the coupling force between the first sealing part 160 and the second substrate 120 and reliability may be improved.

Further, the third sealing part may be disposed between the first sealing part 160 and the first substrate 110. Specifically, a third sealing part 170-2 (hereinafter, interchanged with a second sub-sealing part) may have a second inclined surface SL2. Further, the first sealing part 160 may also have an inclined surface corresponding to the second inclined surface SL2. In addition, a thickness K2 of the second sub-sealing part 170-2 may decrease from an outer side to an inner side. That is, since the first substrate 110 is disposed under the first sealing part 160, in order to improve the coupling force between the first substrate 110 and the first sealing part 160, the second sub-sealing part 170-2 may be disposed at the outer side of the first sealing part 160. Further, according to this configuration, manufacture may be easy.

In addition, the third sealing part may be disposed between the first sealing part 160 and the second sealing part 180. A third sealing part 170-3 (hereinafter, interchanged with a third sub-sealing part) may also have an inclined surface, but the shape is not limited thereto. The third sub-sealing part 170-3 may improve the coupling force between the first sealing part 160 and the second sealing part 180 and prevent fluid from moving from the outside to the inside of the thermoelectric module through the opening H.

Further, the third sealing part may be disposed between the second sealing part 180 and the first substrate 110. In addition, a third sealing part 170-4 (hereinafter, interchanged with a fourth sub-sealing part) may also have an inclined surface, but is not limited thereto. The fourth sub-sealing part 170-4 may improve the coupling force between the first substrate and the second sealing part 180.

FIGS. 8A to 8E are flow charts for describing a method of manufacturing the thermoelectric module according to the first embodiment.

The method of manufacturing the thermoelectric module according to the first embodiment includes disposing a second substrate, a first substrate, a second electrode, a first electrode, a thermoelectric leg, and a plurality of wire parts, disposing a first sealing part and a second sealing part, disposing a third sealing part, and extracting an inner gas and bonding the inner surface of the second sealing part and the outer surfaces of the plurality of wire parts.

Referring to FIG. 8A, a step of disposing the second substrate, the first substrate, the second electrode, the first electrode, the thermoelectric leg, and the plurality of wire parts may be performed.

Specifically, as described above, a second substrate 120 and a first substrate 110 facing the second substrate 120 may be disposed. Further, a second electrode 140 may be disposed under the second substrate 120, and a first electrode 130 may be disposed on the first substrate 110. Here, the second electrode 140 and the first electrode 130 may be disposed to face each other. Further, a plurality of thermoelectric legs 150 may be disposed between the second electrode 140 and the first electrode 130, and the plurality of thermoelectric legs 150 may be disposed between the second electrode 140 and the first electrode 130 facing each other. The second electrode 140 and the first electrode 130 may be electrically connected through the thermoelectric legs 150. Further, the thermoelectric legs 150 may include first thermoelectric legs 151 and second thermoelectric legs 152 in plural numbers. The above-described contents may be equally applied to detailed descriptions of the above-described configurations.

Referring to FIG. 8B, a first sealing part 160 and a second sealing part 180 may be disposed. The first sealing part 160 may be disposed on the first substrate 110 and may be disposed to come into contact with side surfaces of the second substrate 120. Specifically, the first sealing part 160 may be disposed to extend along an edge of an upper surface of the first substrate 110. Further, the first sealing part 160 may be disposed to come into contact with the side surfaces of the second substrate 120. That is, the first sealing part 160

Referring to FIGS. 8D and 8E, a gas in the thermoelectric module may be extracted, and the inner surface of the second sealing part 180 and the outer surfaces of the plurality of plurality of wire parts may be bonded. Specifically, an extractor I may be connected to the second sealing part 180 and the gas in the thermoelectric module may be extracted to the outside or into the extractor I through the second sealing part 180. According to this configuration, the inside of the thermoelectric module may be in a vacuum state.

TABLE 1

| Classification | Vacuum level (Pa) | Input voltage (V) | Cooling part heat capacity (W) | Heat dissipation part heat capacity (W) | Cooling part heat capacity change amount (W) | Cooling part heat capacity change amount (%) | Temperature difference (dT, ° C.) | Temperature difference change amount (W) | Temperature difference change amount (%) |
|---|---|---|---|---|---|---|---|---|---|
| Comparative example | | 22 | 21.35 | 83.85 | (reference) | | 63.64 | | |
| Experimental Example1 | $1 \times 10^{-1}$ | 22 | 21.65 | 83.84 | 0.30 | +1.4% | 63.84 | 0.20 | 0.3 |
| Experimental Example2 | $8 \times 10^{-2}$ | 22 | 21.77 | 83.85 | 0.42 | +2.0% | 63.87 | 0.23 | 0.4 |
| Experimental Example3 | $4 \times 10^{-2}$ | 22 | 21.79 | 83.85 | 0.44 | +2.1% | 63.9 | 0.26 | 0.4 | is disposed to surround the second electrode 140, the first electrode 130, and the thermoelectric legs 150 disposed between the second substrate 120 and the first substrate 110.

Further, an upper surface of the first sealing part 160 may form a step with an upper surface 120a of the second substrate 120. In addition, as described above, the first sealing part 160 may include the opening H. The opening H may be disposed in an extending direction of the above-described plurality of wire parts L in the first sealing part 160. The opening H may be a through hole, but is not limited to this shape. Further, the opening H may be disposed to correspond to the positions of the plurality of wire parts L in the first sealing part 160.

The second sealing part 180 may be disposed under the first sealing part 160 to support the first sealing part 160. Further, the second sealing part 180 may be disposed in the opening of the first sealing part 160. In addition, the second sealing part 180 may be formed to partially surround the plurality of wire parts L. The above-described contents may be equally applied to detailed descriptions of the second sealing part 180.

Referring to FIG. 8C, a third sealing part 170 may be disposed. Specifically, the third sealing part 170 may be disposed at an outer side of the first sealing part 160 to surround the first sealing part 160. The third sealing part 170 may seal the inside of the first sealing part by improving the bonding force with other components which come into contact with the first sealing part 160. The third sealing part 170 may be disposed in the region to seal a region between the second substrate 120 and the first sealing part 160, a region between the first substrate 110 and the first sealing part 160, and a region between the first substrate 110 and the second sealing part 180. The above-described contents may be equally applied to detailed descriptions of the third sealing part.

The Comparative Example is a result of measuring heat capacity (W) of the cooling part, heat capacity (W) of the heat dissipation part, a heat capacity change amount (W, %) of the cooling part, and the temperature difference (temperature difference change amount (W, %)) for a thermoelectric module which has not been evacuated by extracting the gas in the thermoelectric module according to the above-described embodiment. Further, Experimental Examples 1 to 3 are results of measuring heat capacity (W) of the cooling part, heat capacity (W) of the heat dissipation part, heat capacity change amount (W, %) the cooling part, the temperature difference (dT, ° C.), and the temperature difference change amount (W, %) for a thermoelectric module having the above-mentioned vacuum level by extracting the gas in the thermoelectric module according to the embodiment. In comparing Comparative Example and Experimental Examples 1 to 3, it can be seen that the heat capacity of the cooling part increases in the thermoelectric module through internal evacuation. Further, it can be seen that the heat capacity of the heat generating part is maintained, but the temperature difference also increases as the heat capacity of the cooling part increases. Accordingly, it can be seen that the thermoelectric module according to the embodiment improves the temperature difference through heat insulation of the heat generating part and the heat absorption part by evacuating the inside.

Further, the second sealing part 180 may contract by applying heat to a portion B outside the first sealing part 160. Accordingly, the inner surface of the second sealing part 180 and the outer surfaces of the plurality of wire parts may come into close contact with each other to be bonded. Through this, the sealing property of the thermoelectric module by the first and second substrates 110 and 120 and the first sealing part 160 may be significantly improved. The second sealing part 180 may be formed of a film or sheet of a resin material which can be melted by heat, but is not limited thereto. For example, since the second sealing part 180 is made of a resin material which can be melted by heat, the coupling force with the plurality of wire parts L may further increase, and thus the sealing property by the first and second substrates 110 and 120, the first sealing part 160, and the second sealing part 180 may be significantly improved. Thereafter, the second sealing part 180 may be cut to the second region, and as described above, the third sealing part 170 may be formed to be elongated to the outer side of the second sealing part 180.

The invention claimed is:

1. A thermoelectric module comprising:
a first substrate having a top surface and a bottom surface;
a first electrode disposed on the top surface of the first substrate such that the top surface is between the first electrode and the bottom surface;
a thermoelectric leg disposed on the first electrode;
a second electrode disposed on the thermoelectric leg, wherein the thermoelectric leg is to extend in a first direction from the first electrode toward the second electrode;
a second substrate disposed on the second electrode, wherein the second substrate includes a bottom surface to face the first substrate, a top surface to face away from the first substrate, and side surfaces each separately disposed between the bottom surface and the top surface;
a plurality of wire parts electrically connected to the first electrode and the second electrode;
a first sealing part disposed on the top surface of the first substrate, and to extend in the first direction from an edge of the top surface of the first substrate and to contact the side surfaces of the second substrate, wherein the first sealing part includes an inner side that faces the thermoelectric leg and an outer side that faces away from the inner side, wherein the outer side is spaced apart from the inner side in a second direction, wherein the outer side of the first sealing part is aligned in the first direction with a part of the first substrate that does not overlap with the second substrate in the first direction; and
a second sealing part configured to extend, in the second direction, through the outer side of the first sealing part and through the inner side of the first sealing part,
wherein at least one of the plurality of wire parts is partially disposed in the second sealing part,
the second sealing part includes a first region most adjacent to the first sealing part at the outer side of the first sealing part, and a second region which is disposed at an outer side of the first region such that the second region is spaced apart from the first region in the second direction and the second region comes into contact with the wire part which is partially disposed in the second sealing part, and
a thickness of the second region of the second sealing part is smaller than a thickness of the first region of the second sealing part.

2. The thermoelectric module of claim 1, wherein the first region of the second sealing part is disposed to be spaced apart from the wire part partially disposed in the second sealing part.

3. The thermoelectric module of claim 1, wherein:
the second sealing part includes a third region disposed between the first region and the second region; and
a thickness of the third region of the second sealing part decreases as the third region becomes closer to the second region of the second sealing part.

4. The thermoelectric module of claim 1, further comprising a third sealing part disposed between the first substrate and the first sealing part, between the second substrate and the first sealing part, and between the first substrate and the second sealing part.

5. The thermoelectric module of claim 4, wherein:
an upper surface of the first sealing part is disposed under an upper surface of the second substrate; and
an upper surface of the third sealing part is disposed under the upper surface of the second substrate.

6. The thermoelectric module of claim 4, wherein:
the third sealing part extends to an outer side of the second region on the second sealing part; and
the third sealing part extends to an outer side of the second sealing part and onto the plurality of wire parts.

7. The thermoelectric module of claim 1, wherein the first sealing part is disposed to extend along an edge of an upper surface of the second substrate.

8. The thermoelectric module of claim 1, wherein the first sealing part is disposed to surround the second electrode, the first electrode, and the thermoelectric leg.

9. The thermoelectric module of claim 1,
wherein the first sealing part includes:
an inner surface at the inner side of the first sealing part, wherein part of the inner surface is to contact at least one of the side surfaces of the second substrate;
an outer surface at the outer side of the first sealing part; and
a top surface to connect the inner surface to the outer surface.

10. The thermoelectric module of claim 9, wherein a step is provided from the top surface of the first sealing part to the top surface of the second substrate.

11. The thermoelectric module of claim 9, comprising a third sealing part to cover the outer surface of the first sealing part and the top surface of the first sealing part.

* * * * *